(12) United States Patent
Sharma et al.

(10) Patent No.: US 10,930,343 B2
(45) Date of Patent: Feb. 23, 2021

(54) SYMMETRIC BIPOLAR SWITCHING IN MEMRISTORS FOR ARTIFICIAL INTELLIGENCE HARDWARE

(71) Applicant: Hewlett Packard Enterprise Development LP, Houston, TX (US)

(72) Inventors: Amit S. Sharma, Palo Alto, CA (US); Suhas Kumar, Palo Alto, CA (US); Xia Sheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 128 days.

(21) Appl. No.: 16/107,063

(22) Filed: Aug. 21, 2018

(65) Prior Publication Data
US 2020/0066340 A1    Feb. 27, 2020

(51) Int. Cl.
*G11C 13/00* (2006.01)
*H01L 45/00* (2006.01)
*H01L 27/24* (2006.01)
*G11C 8/14* (2006.01)

(52) U.S. Cl.
CPC ........... *G11C 13/0028* (2013.01); *G11C 8/14* (2013.01); *G11C 13/003* (2013.01); *G11C 13/0026* (2013.01); *H01L 27/2481* (2013.01); *H01L 45/1233* (2013.01); *H01L 45/146* (2013.01); *H01L 45/1658* (2013.01); *H01L 45/1666* (2013.01); *H01L 45/1253* (2013.01)

(58) Field of Classification Search
CPC ........... G11C 13/0028; G11C 13/0026; G11C 13/003; G11C 8/14; H01L 27/2481
USPC ........................................................ 365/148
See application file for complete search history.

(56) References Cited

U.S. PATENT DOCUMENTS

| 8,415,650 B2 | 4/2013 | Greene et al. |
| 9,336,870 B1 | 5/2016 | Mickel et al. |
| (Continued) | | |

FOREIGN PATENT DOCUMENTS

| WO | WO-2016182562 A1 | 11/2016 |
| WO | WO-2017088016 A1 | 6/2017 |

OTHER PUBLICATIONS

Chua Memristor Center, "Mission Statement," 2018, https://cmc-dresden.org/vision/.
(Continued)

*Primary Examiner* — Sung Il Cho
(74) *Attorney, Agent, or Firm* — Sheppard Mullin Richter & Hampton LLP

(57) ABSTRACT

A memristor device includes a first electrode, a second electrode, and a memristor layer disposed between the first electrode and the second electrode. The memristor layer is formed of a metal oxide. The memristor layer includes a plurality of regions that extend between the first electrode and the second electrode. The plurality of regions of the memristor layer are created with different concentrations of oxygen before electrical operation, and, during electrical operation, a voltage-conductance characteristic of the memristor device is controlled based on the different concentrations of oxygen of the plurality of regions. The controlling of the voltage-conductance characteristic includes increasing or decreasing the conductance of the memristor device toward a target conductance at a specific voltage.

26 Claims, 9 Drawing Sheets

(56) References Cited

U.S. PATENT DOCUMENTS

| | | | | |
|---|---|---|---|---|
| 2011/0309321 A1* | 12/2011 | Yang | ................... | H01L 45/146 |
| | | | | 257/5 |
| 2012/0268980 A1* | 10/2012 | Awaya | ................ | H01L 27/2472 |
| | | | | 365/148 |
| 2015/0041751 A1* | 2/2015 | Zhang | ................... | H01L 29/92 |
| | | | | 257/4 |
| 2017/0077179 A1* | 3/2017 | Yang | ...................... | H01L 45/00 |
| 2018/0287058 A1* | 10/2018 | Xia | ................... | G11C 13/0069 |
| 2019/0305216 A1* | 10/2019 | Gosavi | ................... | H01L 43/02 |
| 2020/0227635 A1* | 7/2020 | Yang | ................... | H01L 45/146 |

OTHER PUBLICATIONS

Agarwal et al, "Resistive Memory Device Requirements for a Neural Algorithm Accelerator", International Joint Conference on Neural Networks (IJCNN), 2016, 10 pages.

Jiang et al., "Using Dopants to Tune Oxygen Vacancy Formation in Transition Metal Oxide Resistive Memory", ACS Applied Materials and Interfaces, vol. 9, Issue 19, 2017, pp. 16296-16304.

Kumar et al., "Conduction Channel Formation and Dissolution Due to Oxygen Thermophoresis/Diffusion in Hafnium Oxide Memristors", ACS Nano, vol. 10, 2016, pp. 11205-11210.

Kumar et al., "Direct Observation of Localized Radial Oxygen Migration in Functioning Tantalum Oxide Memristors", Advanced Materials, vol. 28, Issue 14, Apr. 13, 2016, pp. 2772-2776.

Kumar et al., "Oxygen migration during resistance switching and failure of hafnium oxide memristors", Applied Physics Letters, vol. 110, 2017, 103503, 5 pages.

Li et al., "Efficient and self-adaptive in-situ learning in multilayer memristor neural networks", Nature Communications 9, No. 2385, 2018, 8 pages.

\* cited by examiner (a)

(b)

SYMMETRIC BIPOLAR SWITCHING IN MEMRISTORS FOR ARTIFICIAL INTELLIGENCE HARDWARE

BACKGROUND

A resistive memory device, called a memristor, is expected to be employed as memory devices especially in fields that require shorter latency and/or lower power consumption. Given the advantages afforded by a memristor, it is expected that the memristor can be used as part of an arithmetic unit as well as data storage. A conventional memristor device has an asymmetric and non-linear voltage-conductance characteristics, and for that reason, additional circuitry or an additional operation to derive the conductance as a value of stored data from a value of voltage applied to the memristor device may be required. It would be desirable to adjust voltage-conductance characteristics of a memristor device to desired characteristics without the aforementioned overheads.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

DETAILED DESCRIPTION

Figure 1:
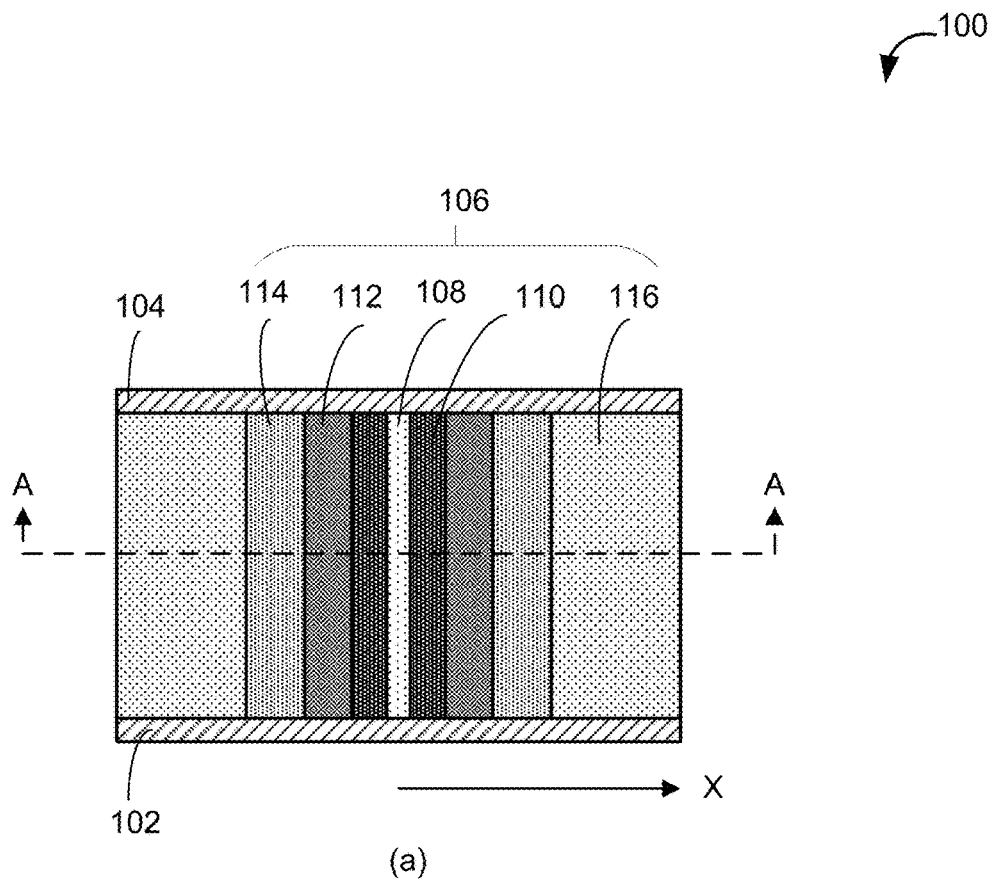
FIG. 1 is a schematic diagram illustrating an exemplary memristor device according to some embodiments.
Figure 1:
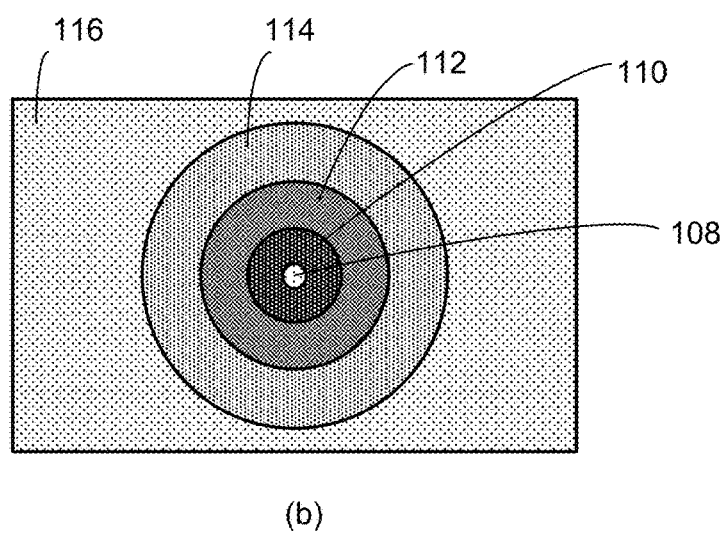

Various embodiments described herein are directed to a memristor device, a memristor-based computing apparatus having one or more memristor devices, and manufacturing methods of a memristor device and a memristor-based computing apparatus. A memristor device according to some embodiments is directed to achieving desired non-volatile conductance states as a function of applied voltage and/or currents, wherein the conductance states that encode information persist even after the applied voltage and/or current is/are withdrawn. Furthermore, the resulting voltage-conductance characteristics are desired to embody certain characteristics, for example, a symmetric and linear voltage-conductance characteristic in either one or both of voltage increase and decrease directions at least in a predetermined voltage range usable for operation. Increase or decrease of voltage applied between the terminals of a memristor may be interchangeably referenced, for example, decreasing voltage may mean increasing the magnitude of applied negative voltage, or also increasing the magnitude of applied positive voltage in an opposite direction. In some embodiments, to achieve the purpose, effective concentration of oxygen and/or concentration of a dopant in any active layer of a memristor device are spatially differentiated.

A memristor device according to some embodiments includes a first electrode, a second electrode, and a memristor layer disposed between the first electrode and the second electrode. The memristor layer may be formed of a metal oxide. The memristor layer may include a plurality of regions that extend between the first electrode and the second electrode. The plurality of regions may be created with different concentrations of oxygen before electrical operation, and, during electrical operation, a voltage-conductance characteristic of the memristor device is controlled based on the different concentrations of oxygen of the plurality of regions. The controlling of the voltage-conductance characteristic includes increasing or decreasing the conductance of the memristor device toward a target conductance at a specific voltage.

In some embodiments, the controlling of the voltage-conductance characteristic may include increasing or decreasing the conductance of the memristor device toward a plurality of target conductances in a voltage range. In some embodiments, the voltage-conductance characteristic may indicate a voltage-conductance relationship between the voltage and the conductance of the memristor device The controlling of the voltage-conductance characteristic may cause the voltage-conductance relationship to become linear or more linear in the voltage range. In some embodiments, the voltage-conductance relationship may become more linear as compared with (i) the voltage-conductance relationship of the memristor device prior to the controlling of the voltage-conductance characteristic, or (ii) a voltage-conductance relationship of an otherwise comparable memristor device having a metal-oxide memristor layer with a uniform concentration of oxygen or a more uniform concentration of oxygen.

In some embodiments, the plurality of regions of the memristor layer may be created with different concentrations of a dopant before electrical operation, and, during electrical operation, a voltage-conductance characteristic of the memristor device is controlled based on the different concentrations of the dopant of the plurality of regions.

In some embodiments, the plurality of regions of the memristor layer may be concentric regions. In some embodiments, the plurality of regions of the memristor layer may include three or more regions have different concentrations of oxygen.

A memristor-based computing apparatus according to some embodiments includes an array of pillar electrodes, an array of word lines, and a plurality of memristor cells. The array of pillar electrodes is arranged in a first direction and a second direction, each of the pillar electrodes extending in a third direction. The array of word lines is arranged in the first direction and the third direction, each of the word lines extending in the second direction. The plurality of memristor cells are formed at cross points of the pillar electrodes and the word lines around the pillar electrode. Each of the memristor cells includes a plurality of regions formed between one of the pillar electrodes and one of the word lines. In each memristor cell, the plurality of regions are created with different concentrations of oxygen before electrical operation, and, during electrical operation, a voltage-conductance characteristic of each of the memristor cells is controlled based on the different concentrations of oxygen of the plurality of regions. The controlling of the voltage-conductance characteristic may include increasing or decreasing the conductances of the memristor cells toward a target conductance at a specific voltage.

In some embodiments, the memristor-based computing apparatus may further include a control circuit configured to perform a matrix-matrix or vector-matrix multiplication by programming data in at least a part of the memristor cells. In some embodiments, the plurality of regions of each of the memristor cells include three or more regions having different concentrations of oxygen.

A method for manufacturing a memristor device according to some embodiments includes forming a first electrode, forming a metal oxide layer on the first electrode, forming a first mask on a first region of the metal oxide layer to be formed as a memristor layer, and introducing oxygen to a second region of the metal oxide layer not covered by the first mask. The method further includes forming a second mask on the second region and a third region within the first region, introducing oxygen to a fourth region of the metal oxide layer not covered by the second mask, and forming a second electrode on the metal oxide layer. Oxygen may be introduced to create a spatial oxygen gradient, such that a voltage-conductance characteristic of the memristor device during electrical operation is controlled based on different concentrations of oxygen of the third and fourth regions.

In some embodiments, the method further includes introducing a dopant to the fourth region of the metal oxide layer not covered by the second mask. The dopant may be introduced such that a voltage-conductance characteristic of the memristor device during electrical operation is controlled based on the different concentrations of the dopant of the plurality of regions.

A method for manufacturing a memristor device according to some embodiments includes forming a first electrode, forming a metal or metal oxide layer on the first electrode, forming a mask on a first region of the metal or metal oxide layer to be formed as a memristor layer, and patterning the metal or metal oxide layer using the mask. The method further includes introducing oxygen to a side surface of the patterned metal or metal oxide layer, forming a cover layer on an exposed surface of the first electrode to cover the side surface of the patterned and oxygen-exposed metal or metal oxide layer, performing planarization on the cover layer and the mask to expose an upper surface of patterned metal oxide layer, and forming a second electrode on the upper surface of the metal oxide layer. Oxygen may be introduced in the steps outlined above, such that a voltage-conductance characteristic of the memristor device during electrical operation is controlled based on different concentrations of oxygen of the third and fourth regions.

According to a memristor device of some embodiments, desired voltage-conductance characteristics, such as a symmetric and non-linear characteristics, may be obtained. When symmetric and linear characteristics are obtained, it may be possible to perform arithmetic calculation without employing an additional operation or an additional circuitry following outputs of the memristor device. As a result, a faster and low power operation can be carried out with a smaller device footprint. Such an arithmetic calculation may be suitably employed in an artificial intelligence (AI) based operation, which requires extensive calculation, in particular matrix-matrix and vector-matrix calculation (multiplication). AI-based operation may be applied to fields, such as image recognition, pattern matching, and vehicle routing.

FIG. 1 is a schematic diagram 100 illustrating an exemplary memristor device according to some embodiments. (a) of FIG. 1 illustrates a side cross-sectional view of the exemplary memristor device, and (b) of FIG. 1 illustrates a cross-sectional view of the exemplary memristor device taken along A-A line in (a) of FIG. 1. The exemplary memristor device includes a first electrode 102, a second electrode 104, and a memristor layer 106 formed therebetween. The memristor layer 106 includes a center region 108, a first surrounding region 110, a second surrounding region 112, a third surrounding region 114, and a peripheral region 116.

The first electrode 102 is an electrode on which the memristor layer 106 is formed. The first electrode 102 may be referred to as a bottom electrode. The first electrode 102 may serve as either an anode or a cathode. Any applicable conductive materials can be employed for the first electrode 102. The second electrode 104 is an electrode formed on the memristor layer 106. The second electrode 104 may be referred to as an upper electrode. The second electrode 104 may serve as either a cathode or an anode opposite to the electrode functionality of the first electrode 102. Any applicable conductive materials can be employed for the second electrode 104.

The memristor layer 106 is an active layer for storing electric charges in the form of its conductance, corresponding to a value of data stored therein, and formed between the first electrode 102 and the second electrode 104. The memristor layer 106 may be formed of a variety of materials. The memristor layer 106 may be oxide-based, meaning that at least a portion of the memristor is formed from an oxide-containing material. The memristor layer 106 may also be nitride-based, meaning that at least a portion of the memristor is formed from a nitride-containing composition. Furthermore, the memristor layer 106 may be oxy-nitride based, meaning that a portion of the memristor is formed from an oxide-containing material and that a portion of the memristor is formed from a nitride-containing material. In some examples, the memristor layer 106 may be formed based on tantalum oxide (TaOx) or hafnium oxide (HfOx) compositions. Other example materials of the memristor layer 106 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning materials, including an n-dopant and/or a p-dopant, may be employed in the practice of the teachings herein. Other examples of the memristor layer 106 may be based on silicon oxide, silicon nitride, and silicon oxy-nitride. For example, the memristor layer 106 may have multiple layers that include electrodes and dielectric materials.

The center region 108, the first surrounding region 110, the second surrounding region 112, and the third surrounding region 114 are concentric regions, and each extends between the first electrode 102 and the second electrode 104. The peripheral region 116 is formed around the third surrounding region 114 and also extends between the first electrode 102 and the second electrode 104. Those regions of the memristor layer 106 may be collectively referred to as functional regions. Depending on a specific implementation, the number of the functional regions may be determined appropriately, and may not be five, and may be less than or more than five. For example, the functional regions may include two regions within a peripheral region.

In some embodiments, the functional regions of the memristor layer 106 may have the same ingredients (e.g., metal oxide) with different concentration of one or more ingredients. For example, the center region 108, the first surrounding region 110, the second surrounding region 112, the third surrounding region 114, and the peripheral region 116 may be formed of the same metal oxide with different concentration of oxygen. In another example, the center region 108, the first surrounding region 110, the second surrounding region 112, the third surrounding region 114, and the peripheral region 116 may further differ in the concentration of a dopant.

Figure 2:
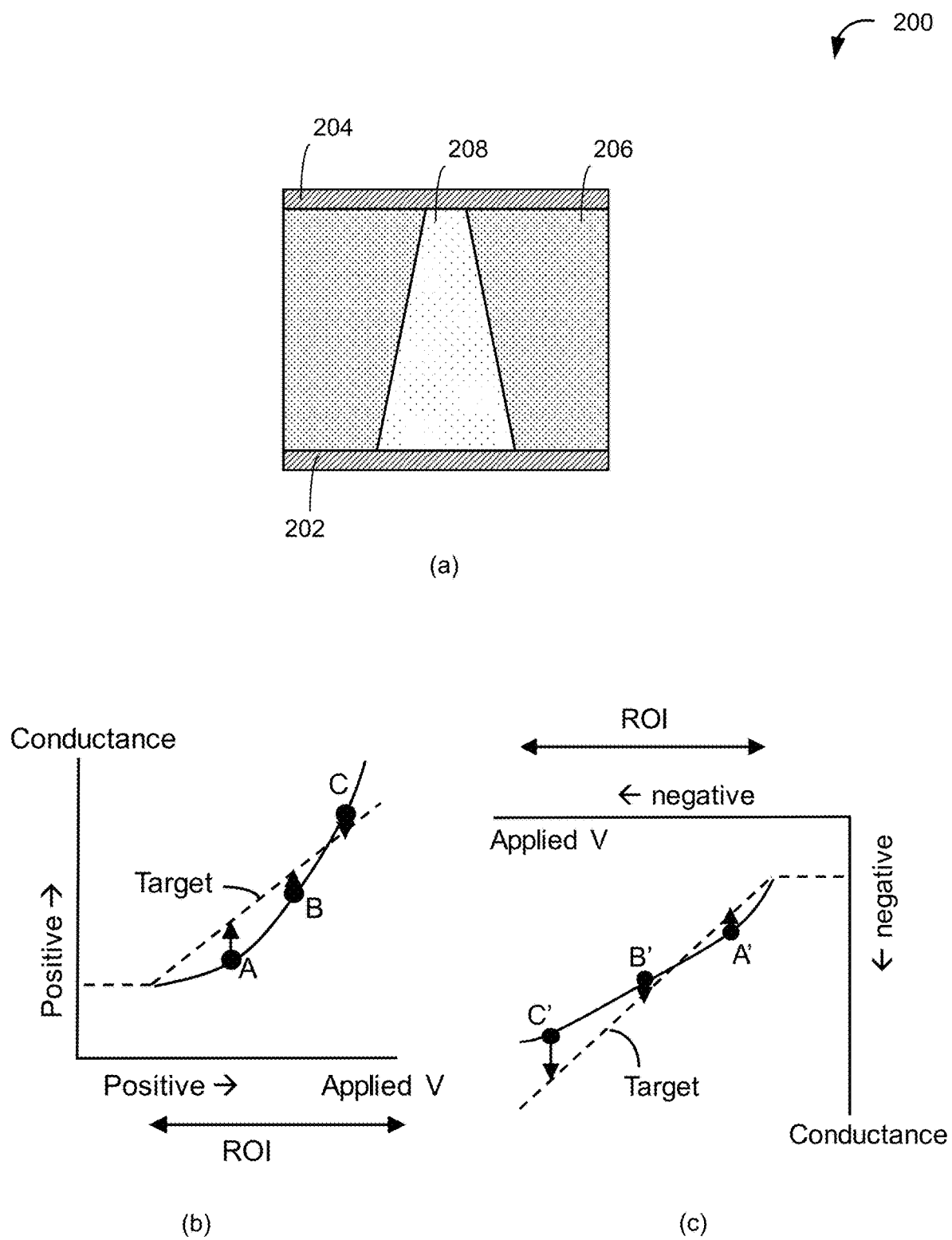
FIG. 2 is a schematic diagram illustrating a comparative memristor with a uniform active layer and characteristics of the comparative memristor.

In some embodiments, the functional regions of the memristor layer 106 may be configured, such that a filament of oxygen vacancies (see (a) of FIG. 2) is formed at a position approximately corresponding to the center region 108 of the memristor layer 106. The filament of oxygen vacancies is typically formed when an initial higher voltage is applied to a memristor device, such that the memristor device functions accordingly thereafter. When in operation, a current passes through the filament of oxygen vacancies. To achieve this purpose, the oxygen concentration of the center region 108 may be set to be lower than the first surrounding region 110. For example, the oxygen concentration may be higher in the order of the third surrounding region 114, the second surrounding region 112, the first surrounding region 110, the peripheral region 116, and the center region 108.

In some embodiments, the functional regions of the memristor layer 106 may be configured, such that a voltage-conductance characteristic of the memristor device during electrical operation is controlled based on the different concentrations of oxygen of the functional regions. The controlling of the voltage-conductance characteristic may include increasing or decreasing the conductance of the memristor device toward a target conductance at a specific voltage.

More particularly, in some embodiments, the functional regions of the memristor layer 106 may be configured, such that a voltage-conductance characteristic of the memristor device becomes more linear in a predetermined voltage range (e.g., region of interest (ROI)) as compared to the voltage-conductance relationship of the memristor device prior to the controlling of the voltage-conductance characteristic or a voltage-conductance relationship of a memristor device having a metal-oxide memristor layer with a uniform concentration of oxygen. An underlining concept of the linearity of the voltage-conductance characteristic will be described below with reference to FIGS. 2 and 3. To achieve this purpose, the oxygen concentration of the functional regions of the memristor layer 106 may be set so as to adjust an original voltage-conductance characteristic unique to a primary ingredients (e.g., metal oxide), which is typically non-linear. For example, the oxygen concentration may be higher in the order of the third surrounding region 114, the second surrounding region 112, the first surrounding region 110, the peripheral region 116, and the center region 108. In some embodiments, the voltage-conductance characteristic of the memristor device is a voltage-conductance relationship when a voltage applied to the memristor device increases and/or decreases. The predetermined voltage range may correspond to an operational voltage range of the memristor device. For example, a control circuit is configured to apply a control voltage (e.g., read-, write-, and floating-voltages) to the memristor device in a specific voltage range, the predetermined voltage range may cover or coincide with the specific voltage range.

Here, "more linear" may be defined based on a deviation from a linear voltage-conductance relationship. The deviation may be determined based on a sum of areas between an obtained voltage-conductance relationship and the linear voltage-conductance relationship, and such a value may be obtained by an integral calculation. The metal-oxide memristor layer with the uniform concentration of oxygen corresponds to a metal-oxide memristor layer formed with uniform concentration of oxygen during manufacturing, and/or a metal-oxide memristor layer having the uniform concentration of oxygen.

In some embodiments, oxygen concentrations of the functional regions of the memristor layer 106 may be configured, such that a voltage-conductance characteristic of the memristor device becomes less linear in a predetermined voltage range (e.g., region of interest (ROI)) as compared to the voltage-conductance relationship of the memristor device prior to the controlling of the voltage-conductance characteristic or a voltage-conductance relationship of a memristor device having a metal-oxide memristor layer with a uniform concentration of oxygen. According to multiple functional regions of a memristor layer of some embodiments, oxygen concentration of the functional regions can be configured to achieve any desired voltage-conductance characteristics.

In some embodiments, one or more of the functional regions of the memristor layer 106 may contain a dopant (n-dopant and/or p-dopant), and the concentration of the dopant may be configured, such that a voltage-conductance characteristic of the memristor device during electrical operation is controlled based on the different concentrations of the dopant of the plurality of regions. More particularly, the concentration of the dopant may be configured, such that a voltage-conductance characteristic of the memristor device becomes more linear in a predetermined voltage range (e.g., region of interest (ROI)) as compared to the voltage-conductance relationship of the memristor device prior to the controlling of the voltage-conductance characteristic or a voltage-conductance relationship of a memristor device having a metal-oxide memristor layer without the dopant. In a more specific implementation, the oxygen concentration may be set so as to adjust a voltage-conductance relationship when a voltage applied to the memristor device increases, and the dopant concentration may be set so as to adjust a voltage-conductance relationship when a voltage applied to the memristor device decreases. The function of the oxygen vacancies in the memristor layer 106 and the function of the dopant in the memristor layer 106 may be substantially independent from each other. For that reason, it is possible to adjust the voltage-conductance characteristic in both directions of voltage increase and decrease by appropriately setting the concentration of oxygen and the dopant. The predetermined voltage range corresponding to the dopant concentration may or may not be the same as the predetermined voltage range corresponding to the oxygen concentration.

Similarly to the case of oxygen, dopant concentrations of the functional regions of the memristor layer 106 may be configured, such that a voltage-conductance characteristic of the memristor device becomes less linear in a predetermined voltage range (e.g., region of interest (ROI)) as compared to the voltage-conductance relationship of the memristor device prior to the controlling of the voltage-conductance characteristic or a voltage-conductance relationship of a memristor device having a metal-oxide memristor layer with a uniform concentration of oxygen. According to multiple functional regions of a memristor layer of some embodiments, dopant concentration of the functional regions can be configured to achieve any desired voltage-conductance characteristics.

FIG. 2 is a schematic diagram 200 illustrating a comparative memristor device with a uniform active layer and characteristics of the comparative memristor device. (a) of FIG. 2 illustrates a comparative memristor device of a uniform concentration of oxygen in a memristor layer. (b) of FIG. 2 illustrates a voltage-conductance characteristic of the memristor device when a voltage applied to the memristor device increases. (c) of FIG. 2 illustrates a voltage-conductance characteristic of the memristor device when a voltage applied to the memristor device decreases.

As shown in (a) of FIG. 2, after an initial high voltage is applied to the comparative memristor device, which includes a first electrode 202, a second electrode 204, and a memristor layer 206, a filament 208 of oxygen vacancies is formed at a region of the memristor layer 206. When a positive voltage is applied to the memristor device, the filament 208 grows by attracting more oxygen vacancies. As a result, the conductance of the memristor device increases. In an example, the voltage-conductance characteristic of the memristor device may become the solid line in (b) of FIG. 2, which is non-linear. This non-linear voltage-conductance characteristic of the memristor device may be considered to be caused by various reasons, including existence or generation of oxygen vacancies (or vacancy-interstitial pairs) in the memristor layer and movement of oxygen vacancies governed by Fick law of diffusion (time-domain rule) and/or Soret diffusion (temperature-domain rule), both of which contribute to cause the conductance variance an a substantially non-linear manner.

When a negative voltage is applied to the memristor device, the filament 208 shrinks by expelling more oxygen vacancies. As a result, the conductance of the memristor device decreases. In an example, the voltage-conductance characteristic of the memristor device may become the solid line in (c) of FIG. 2, which is non-linear. This non-linear voltage-conductance characteristic of the memristor device may be considered to be caused by reasons at least partially different from the non-linear voltage-conductance characteristic of the memristor device when the applied voltage increases. Those reasons include clustering of energy of oxygen vacancies, net charge on oxygen vacancies, and the Fick law of diffusion. The voltage-conductance characteristics of the memristor device, as a result, may be asymmetric between voltage increase and voltage decrease.

When the voltage-conductance characteristics of the memristor device are non-linear and asymmetric, an extra operation and/or a circuit component may be needed to obtain a value of stored data therefrom. For example, an operation algorithm for obtaining a value (conductance value) from a voltage value may be needed, and such an operation algorithm may further need look-up tables. For example, a circuit component configured to implement an operational algorithm for a pulse-shaping may be needed. For example, a circuit component including transistors, at every node or rows of nodes. Such extra operation and/or extra circuit components may be a drawback in terms of a device space, latency, and/or power consumption. For those reasons, in some embodiments, it may be preferable to have linear and symmetric voltage-conductance characteristics of the memristor device, as shown in the dashed lines in (b) and (c) of FIG. 2 (labeled "target").

Further, the less operation and circuit overhead achievable by the linear and symmetric voltage-conductance characteristics of the memristor device may be beneficial in hardware implementing an artificial intelligence (AI). This is because the AI-implementing hardware may require an extensive amount of calculation of parameters, such as matrix-matrix calculation (e.g., multiplication), and memristor devices having the linear and symmetric voltage-conductance characteristics can lead to faster processing with less circuit components. Specifically, calculation using memristor devices having the linear and symmetric voltage-conductance characteristics may lead to reduced latency in training deep neural networks and/or reduced latency in neural network optimization via algorithms such as gradient descent to set the optimal weights matrix. Moreover, reduced power consumption in programming/training/learning may be achieved due to minimization or elimination of the overhead circuits. In some specific implementation, the AI-implementing hardware employing memristor devices according to some embodiments may be applied to various applicable fields, including image recognition, pattern matching, and solving of non-deterministic polynomial-time hard problems (NP-hard problems) such as vehicle routing.

To achieve the linear and symmetric voltage-conductance characteristics of the memristor device, in (b) of FIG. 2, conductance at point A may need to be relatively significantly increased, conductance at point B may need to be slightly increased, and conductance at point C may need to be slightly decreased. Similarly, in (c) of FIG. 2, conductance at point A' may need to be slightly increased, conductance at point B' may need to be slightly decreased, and conductance at point C' may need to be relatively significantly decreased. One solution to adjust the voltage-conductance characteristics of the memristor device to be linear and symmetric would be differentiating oxygen concentration and/or dopant concentration in a memristor layer spatially.

Figure 3:
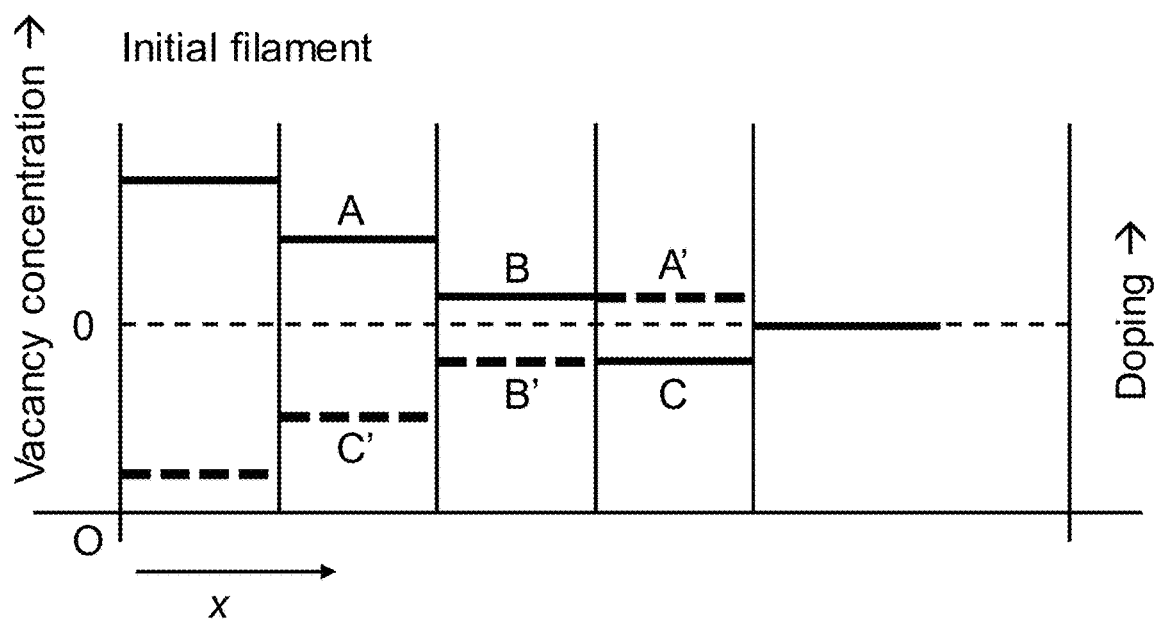
FIG. 3 is a schematic diagram illustrating an example of an amount of vacancy and a doping material to be introduced in a memristor to achieve desired characteristics.

FIG. 3 is a schematic diagram 300 illustrating an example of an amount of vacancy and a doping material to be introduced in a memristor to achieve desired characteristics. In FIG. 3, "O" corresponds to a center of a memristor device, which corresponds to a center of a filament, and a dashed line at "0" corresponds to levels of oxygen vacancies in the comparative memristor device. Also, the bold solid lines correspond to levels of oxygen vacancy in the comparative memristor device to be added to achieve the target conductance levels at points A, B, and C within the ROI of the voltage-conductance characteristic. Similarly, and the bold dashed lines correspond to levels of a dopant to be added to achieve the target conductance levels at points A', B', and C' within the ROI of the voltage-conductance characteristic. The amount of oxygen vacancies and the dopant illustrated in FIG. 3 are merely examples, and the amount may depend on specific ingredients (e.g., metal oxide) of the memristor layer. It is noted here that the oxygen vacancy and the dopant are known to function independently from each other under certain conditions, and therefore the amount of the oxygen vacancy and the dopant may be determined independently.

Figure 4:
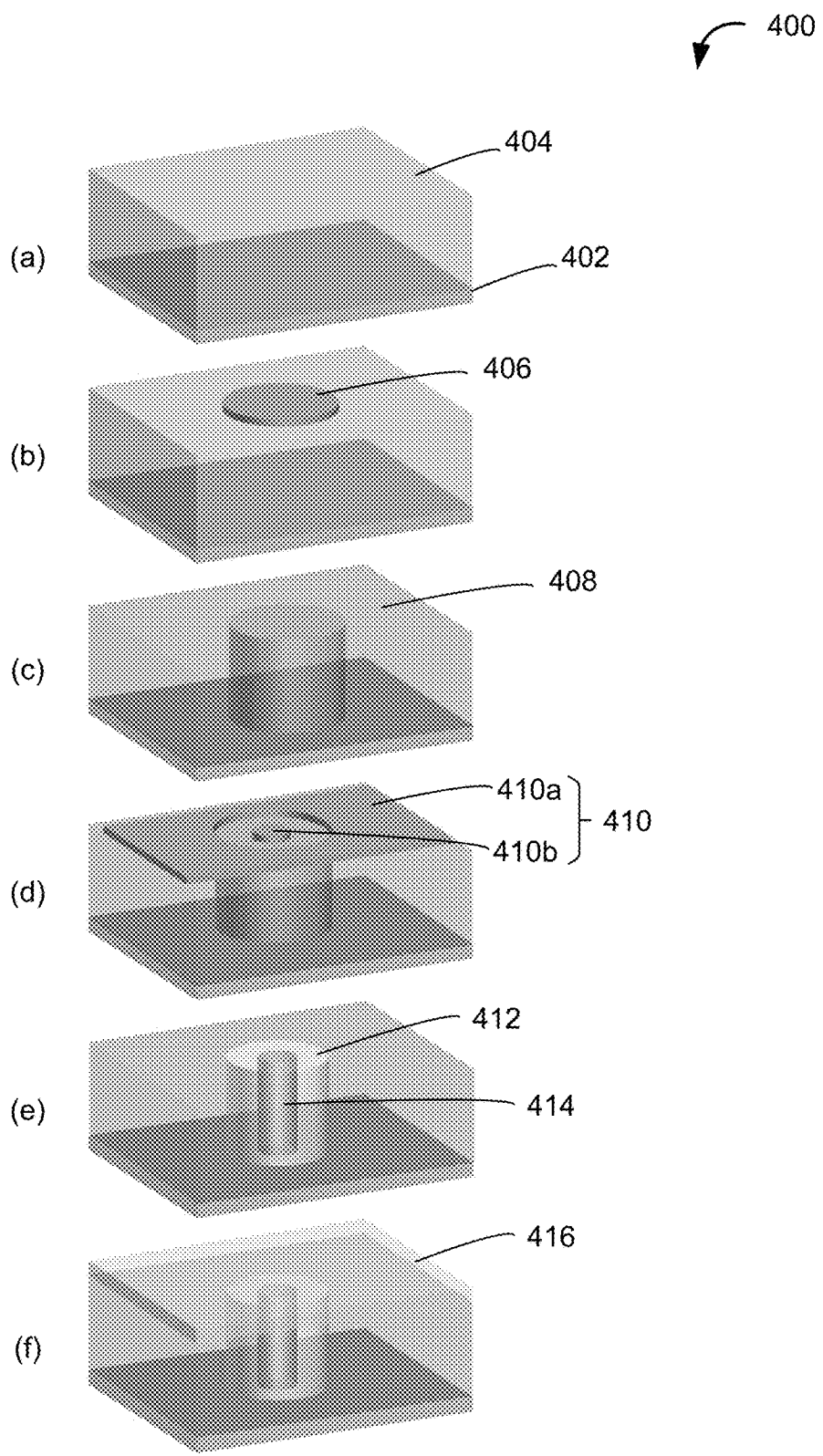
FIG. 4 is a schematic diagram illustrating an exemplary manufacturing method of a memristor device according to some embodiments.

FIG. 4 is a schematic diagram 400 illustrating an exemplary manufacturing method of a memristor device according to some embodiments. In the exemplary manufacturing methods described here and below, a memristor layer having two regions of different concentrations of oxygen is formed. Depending on a specific implementation, the number of regions of different concentrations of oxygen may be appropriately determined, and manufactured by repeating the same or similar process using a mask of a corresponding pattern. First, a first electrode 402 is formed on a substrate (not shown).

Thereafter, as shown in (a) of FIG. 4, a metal oxide layer 404 is formed on the first electrode 402. In a specific implementation, the metal oxide layer 404 is deficient in oxygen and includes many oxygen vacancies therein. The amount of oxygen to be included in the metal oxide layer 404 may be determined by an amount of oxygen introduced into a film forming chamber.

Thereafter, as shown in (b) of FIG. 4, a first mask 406 is formed on a region of the metal oxide layer 404 to be formed as a memristor layer. Hereinafter, this region is referred to as a first region.

Thereafter, as shown in (c) of FIG. 4, oxygen is introduced into an exposed region of the metal oxide layer 404 not covered by the first mask 406. The exposed region of the metal oxide layer 404 is referred to as a second region 408. As a result, the second region 408 of the metal oxide layer 404 becomes to have a higher concentration of oxygen (e.g., neutral concentration), and an oxygen-deficient cylindrical part of the metal oxide layer 404 corresponding to the first region is formed.

More complicated composition profiles can be achieved by further processes, as outlined in this paragraph. Thereafter, as shown in (d) of FIG. 4, a second mask 410 is formed. The second mask 410 includes a first portion 410*a* corresponding to the second region 408 of the metal oxide layer 404 and a second portion 410*b* corresponding to a region (hereinafter, a third region 414) within the first region of the metal oxide layer 404. As a result, an exposed region (hereinafter, a fourth region 412) not covered by the second mask 410 is formed.

Thereafter, as shown in (e) of FIG. 4, oxygen is introduced into the fourth region 412 of the metal oxide layer 404 not covered by the second mask 410. As a result, the fourth region 412 of the metal oxide layer 404 becomes to have a higher concentration of oxygen (e.g., oxygen rich), and an oxygen-deficient cylindrical part of the metal oxide layer 404 corresponding to the third region 414 is formed. In some embodiments, the concentration of oxygen in the second region 408 of the metal oxide layer 404 is lower than that in the fourth region 412. That is, the concentration of oxygen in higher in the order of the fourth region 412, the second region 408, and the third region 414.

In this step, oxygen is introduced into the fourth region 412 of the metal oxide layer 404, such that a voltage-conductance characteristic of the memristor device during electrical operation is controlled based on different concentrations of oxygen of the third and fourth regions. In some embodiments, the controlling of the voltage-conductance characteristic may include increasing or decreasing the conductance of the memristor device toward a target conductance at a specific voltage.

In some embodiments, when the oxygen is introduced into the fourth region 412 of the metal oxide layer 404, a dopant may be introduced thereinto together. As a result, the multiple metal oxide regions 412 and 414 may have different concentrations of the dopant. The different concentrations of the dopant may be configured, such that a voltage-conductance characteristic of the memristor device during electrical operation is controlled based on the different concentrations of the dopant of the plurality of regions.

Thereafter, as shown in (f) of FIG. 4, a second electrode 416 is formed on the metal oxide layer 404, so as to at least cover the third regions 414 and the fourth region 412 of the metal oxide layer 404. As a result, a memristor device having different concentrations of oxygen can be manufactured.

Figure 5:
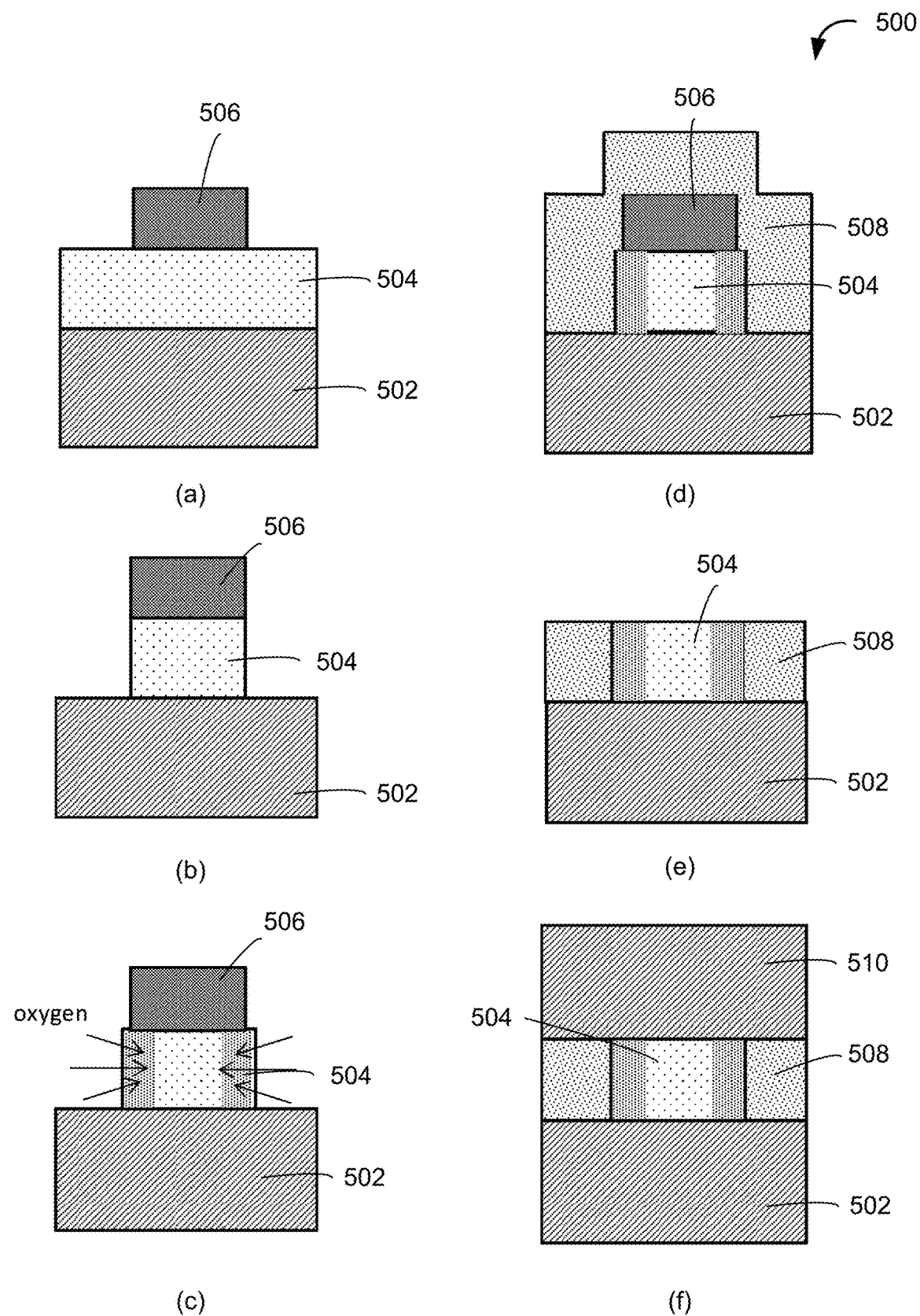
FIG. 5 is a schematic diagram illustrating another exemplary manufacturing method of a memristor device according to some embodiments.

FIG. 5 is a schematic diagram 500 illustrating another exemplary manufacturing method of a memristor device according to some embodiments. First, a first electrode 502 is formed on a substrate (not shown). Thereafter, as shown in (a) of FIG. 5, a metal oxide layer 504 is formed on the first electrode 502. In a specific implementation, the metal oxide layer 504 is deficient in oxygen and includes many oxygen vacancies therein. The metal oxide layer 504 may be referred to as a metal-rich oxide layer. The amount of oxygen to be included in the metal oxide layer 504 may be determined by an amount of oxygen introduced into a film forming chamber.

Thereafter, as shown in (b) of FIG. 5, a mask 506 is formed on a region of the metal oxide layer 504 to etch the memristor layer. In some embodiments, this mask may consist of silicon nitride or a photoresist.

Thereafter, as shown in (c) of FIG. 5, oxygen is introduced into an exposed side surface of the metal oxide layer 504. As a result, a side region of the metal oxide layer 504 becomes to have a higher concentration of oxygen (e.g., oxygen rich), and an oxygen-deficient cylindrical part of the metal oxide layer 504 is formed at a center region.

In this step, oxygen is introduced into the metal oxide layer 504, such that a voltage-conductance characteristic of the memristor device during electrical operation is controlled based on different concentrations of oxygen of the third and fourth region. In some embodiments, the controlling of the voltage-conductance characteristic may include increasing or decreasing the conductance of the memristor device toward a target conductance at a specific voltage.

In some embodiments, when the oxygen is introduced into the metal oxide layer 504, a dopant may be introduced thereinto together. As a result, the multiple metal oxide regions (e.g., the side region and the center region) may have different concentrations of the dopant. The different concentrations of the dopant may be configured, such that a voltage-conductance characteristic of the memristor device during electrical operation is controlled based on the different concentrations of the dopant of the plurality of regions.

Thereafter, as shown in (d) of FIG. 5, a cover layer 508, also known as an inter-layer dielectric, is formed on an exposed surface of the first electrode 502 to cover the side surface of the patterned metal oxide layer 504. In some embodiments, the cover layer 508 may be formed of a metal oxide of the same types of ingredients as the metal oxide layer 504. An annealing process may be used to smooth the oxygen gradient if necessary.

Thereafter, as shown in (e) of FIG. 5, the cover layer 508 and the mask 506 are planarized to expose an upper surface of patterned metal oxide layer 504. Around the oxide layer 504, a remaining part of the cover layer 508 is formed. In some embodiments, the mask 506 may be removed prior to forming the cover layer 508.

Thereafter, as shown in (f) of FIG. 5, a second electrode 510 is formed on the upper surface of the metal oxide layer 504. As a result, a memristor device having different concentrations of oxygen can be manufactured.

According to the manufacturing method of a memristor device depicted in FIG. 5, a clear boundary may not be formed between regions of different concentrations of oxygen. Instead, there may be a gradation of oxygen concentrations. Even in such a case, the memristor device may be said to have multiple regions of different oxygen concentrations. Also, the same is true for the concentration of a dopant if the dopant is included in the metal oxide layer (memristor layer) of the memristor device.

Figure 6:
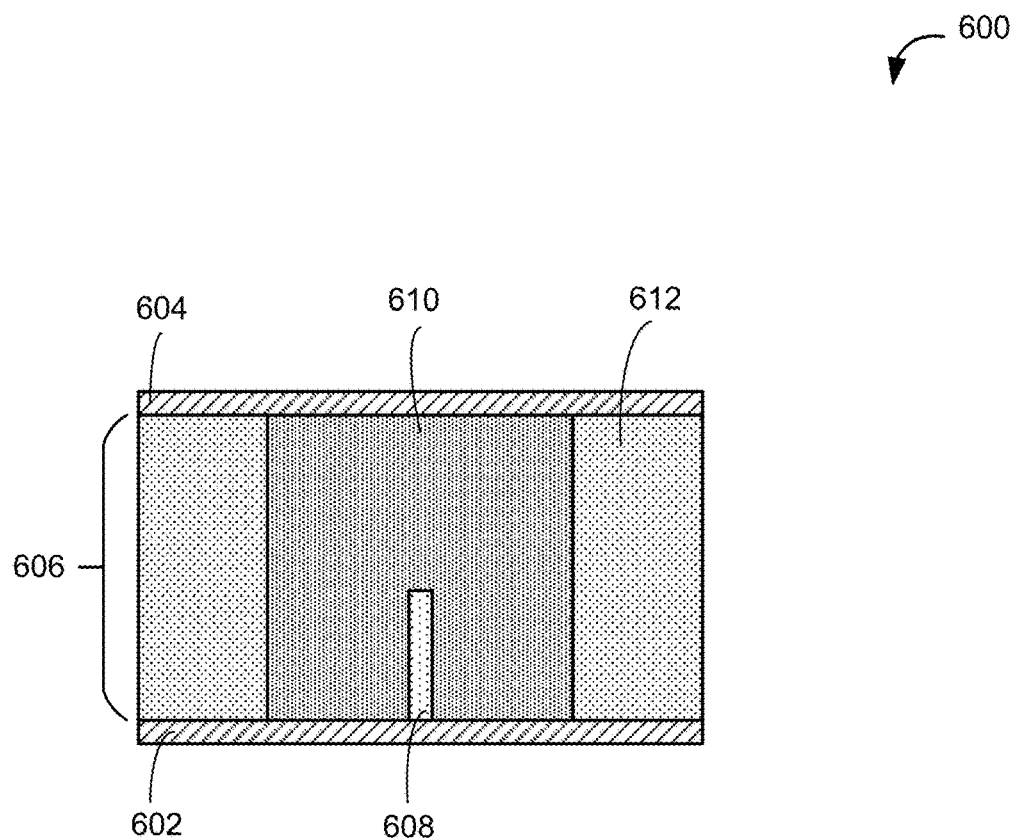
FIG. 6 is a schematic diagram illustrating a cross-sectional view of an exemplary memristor device according to some embodiments.

FIG. 6 is a schematic diagram 600 illustrating a side cross-sectional view of an exemplary memristor device according to some embodiments. The exemplary memristor device includes a first electrode 602, a second electrode 604, and a memristor layer 606 formed therebetween. The memristor layer 606 includes a center region 608, a surrounding region 610, and a peripheral region 612. In some embodiments, concentration of oxygen in the center region 608, the surrounding region 610, and the peripheral region 612 are higher in the order of the surrounding region 610, the peripheral region 612, and the center region 608. Depending on a specific implementation, the specific concentration of oxygen in each region may be appropriately determined considering a desired characteristic (e.g., voltage-conductance characteristics).

The center region 608 does not extend entirely between the first electrode 602 and the second electrode 604, and is terminated in the middle between the first electrode 602 and the second electrode 604. Depending on a specific implementation, the length of the center region 608 may be appropriately determined considering a desired characteristic (e.g., voltage-conductance characteristics).

Figure 7:
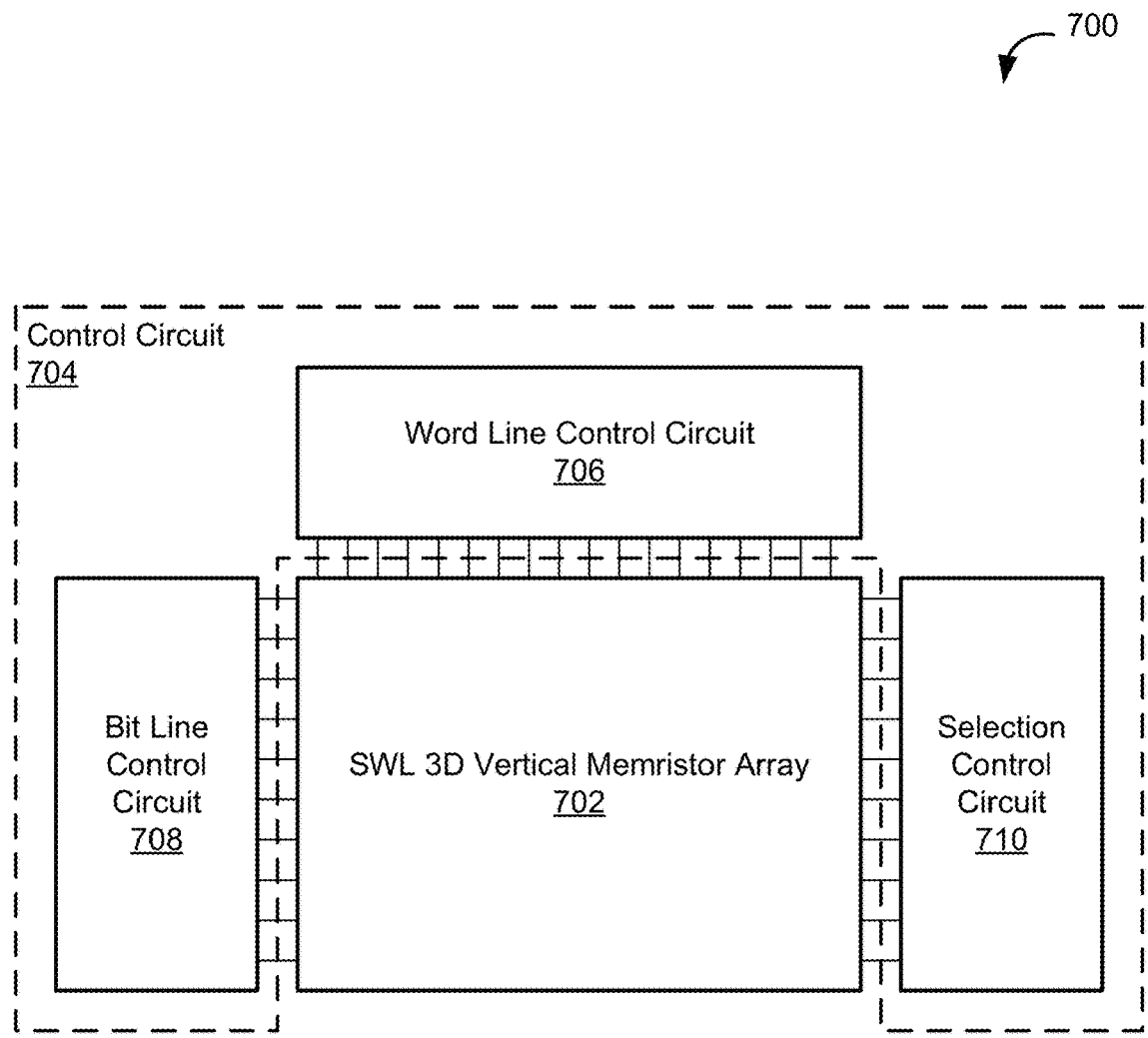
FIG. 7 is a schematic block diagram illustrating an example of a 3D memristor array of a memristor-based computing apparatus according to some embodiments.

FIG. 7 is a schematic block diagram 700 illustrating an example of a 3D memristor array of a memristor-based computing apparatus according to some embodiments.

In the example shown in FIG. 7, the 3D memristor array includes a separate-word-line (SWL) 3D vertical memristor array 702 and a control circuit 704 for controlling the SWL 3D vertical memristor array 702. In FIG. 7, the x direction, y direction, and z direction may be referred to as a row direction, a column direction, and a height direction, respectively. In some embodiments, the row direction and the column direction may be defined as directions along a plane defined by a substrate on which the cross-bar array is formed, and the height direction may be defined as a direction vertical with respect to the plane defined by the substrate.

In the example 3D memristor array shown in FIG. 7, the SWL 3D vertical memristor array 702 represents an array of memristor cells configured three dimensionally in the row, column, and height directions. An example of a detailed structure of an SWL 3D vertical memristor array will be discussed below with reference to FIG. 8. The SWL 3D vertical memristor array 702 includes a plurality of separate word lines in each of the layers extending in the row and column directions (x and y directions) and arranged in the height direction (z direction). The SWL 3D vertical memristor array 702 also includes a plurality of pillar electrodes arranged in the row and column directions (x and y directions) and extending in the height direction (z direction). The array of memristor cells is formed at cross points of the pillar electrodes and the word lines around the pillar electrodes. A memristor cell is formed around a pillar electrode in the sense that a resistive memory layer capable of storing data is formed in substantially an entire region surrounding the pillar electrode. The SWL 3D vertical memristor array 702 has a separate-word-line structure in the sense that a plurality of word lines are formed and arranged in each single plane (layer), as opposed to a single word plane to address all memristor cells formed on the plane. The SWL 3D vertical memristor array 702 is "vertical" in the sense that the pillar electrodes, which are connected to bit lines, extend in the height direction. This is in contrast to a 3D horizontal structure, where bit lines are formed to extend in horizontal direction, which may correspond to the row or column direction in FIG. 7. Each of the memristor cells is configured to store and maintain electrons that pass through the memristor cell, and changes in electric resistance of the memristor cell based on the amount of passed electrons. This corresponds to stored data in the memristor cell.

When a programming operation and a read operation are performed with respect to a memristor cell, a voltage difference is caused between electrodes thereof, that is, a word line and a pillar electrode. Based on the voltage difference between the word line and the pillar electrode connected to the memristor cell to be programmed, electrons pass the memristor cell and data are stored therein during the programming operation. Similarly, based on the voltage difference between the word line and the pillar electrode connected to a memristor cell to be read, a current corresponding to the electric resistance of the memristor cell flows through the memristor cell. As a result, a value corresponding to the current is output as a value of data stored therein during the read operation.

In the example 3D memristor array shown in FIG. 7, the control circuit 704 may refer to circuitry configured to control operation of the SWL 3D vertical memristor array 702. The control circuit 704 includes a word line control circuit 706, a bit line control circuit 708, and a selection control circuit 710. Although not shown in FIG. 7, the control circuit 704 may include other circuit components, such as a power supply control circuit configured to control power supply to the other components of the control circuit 704 and/or the SWL 3D vertical memristor array 702. The control circuit 704 may further include a calculation circuit configured to calculate an output value based on output signals from the SWL 3D vertical memristor array 702.

The word line control circuit 706 may refer to circuitry configured to control words lines of the SWL 3D vertical memristor array 702. More specifically, the word line control circuit 706 control voltages of each of the word lines for operation of the SWL 3D vertical memristor array 702. For example, during a programming (write) operation, data can be programmed into memristor cells of the SWL 3D vertical memristor array 702.

The bit line control circuit 708 can refer to circuitry configured to control bit lines of the SWL 3D vertical memristor array 702. More specifically, the bit line control circuit 708 control voltages of each of the bit lines for operation of the SWL 3D vertical memristor array 702.

The selection control circuit 710 may refer to circuitry configured to control selection elements of the SWL 3D vertical memristor array 702. Each of the selection elements is configured to select a corresponding pillar electrode to access memristor cells formed therearound. For example, during programming operations and/or read operations, the selection control circuit 710 applies a selection voltage (Vs) to one or more selection lines connected to one or more selection elements to be selected. Other selection lines not connected to the one or more selection elements to be selected can be set at a non-selection voltage (Vns (e.g., Vs>Vns)). In some embodiments, the selection elements include switching elements, such as transistors of any applicable types. For example, a field effect transistor (FET) may be employed for the selection element, where a gate electrode of the FET is connected to a corresponding selection line. Series-connected selectors may be employed for the selection elements.

Figure 8:
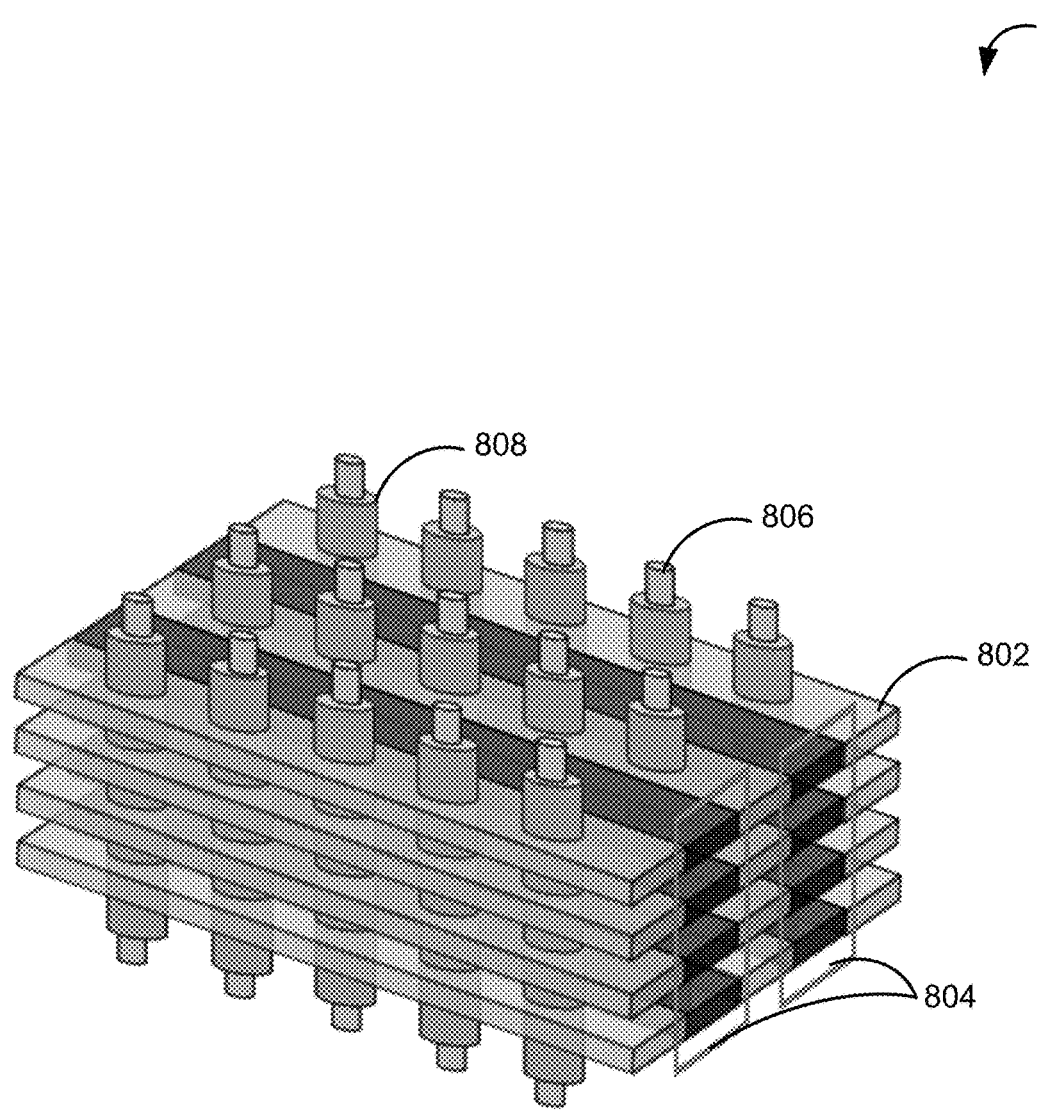
FIG. 8 is a schematic cubic diagram illustrating an example of a 3D memristor array of a memristor-based computing apparatus according to some embodiments.

FIG. 8 is a schematic cubic diagram 800 illustrating an example of a 3D memristor array of a memristor-based computing apparatus according to some embodiments. In the example shown in FIG. 8, the SWL 3D vertical memristor array 800 includes a plurality of word lines 802, a plurality of insulation walls 804, a plurality of pillar electrodes 806, and a plurality of memristor layers 808. In some embodiments, the SWL 3D vertical memristor array 800 corresponds to the SWL 3D vertical memristor array 702 depicted in FIG. 7, and x, y, and z directions in FIG. 8 correspond to those in FIG. 7, respectively.

In the example of FIG. 8, the word lines 802 are formed in multiple layers stacked in a height direction (z direction), and a plurality of word lines 802 is formed in each of the multiple layers stacked in the height direction depicted in FIG. 8. In each layer, the word lines 802 are arranged in a column direction (y direction), and extend in a row direction (x direction). Although no material layer is shown in FIG. 8, an insulation layer is formed between adjacent layers of word lines 802, to electrically separate adjacent word lines in adjacent layers. Any applicable conductive materials can be employed for the word lines 802.

In the example of FIG. 8, the insulation walls 804 may be structures that electrically insulate word lines 802 adjacent to each other in the same layer. As shown, each of the insulation walls 804 extends in the row direction (x direction) to electrically separate between adjacent word lines 802 in the same layer, such that the adjacent word lines 802 are independently operable. Although no material layer is shown in FIG. 8, an insulation layer is formed between adjacent layers of insulation walls 804 shown in FIG. 8, and a single insulation wall extending in the height direction (z direction) may be formed by those insulation structures. In such a case, it may be said that a plurality of insulation walls 804, each extending in the row and height directions, is arranged in the column direction. Any applicable conductive materials, including inorganic materials and organic materials such as resin, can be employed for the insulation walls 804.

In the example of FIG. 8, the pillar electrodes 806 are arranged in the row and column directions, and each of the pillar electrodes 806 extends in the height direction. A plurality of pillar electrodes 806 passes through a plurality of word lines 802 arranged at a same position in the column direction. Any applicable conductive materials can be employed for the pillar electrodes 806. In alternative embodiments, a plurality of pillar electrodes 806 (e.g., two or three pillar electrodes 806), instead of one pillar electrode 806 as shown in FIG. 8, may be arranged between adjacent insulation walls 804. In still alternative embodiments, the pillar electrodes 806 of two columns may be arranged in the column direction (y direction), and a single insulation wall may be formed therebetween.

In the example of FIG. 8, the memristor layers 808 are formed around the plurality of pillar electrodes 806, and each of the memristor layers 808 extends in the height direction along with the corresponding pillar electrode 806. Each of a portion of the memristor layers 808 surrounded by a word line 802 serves as a memristor cell, and the surrounding portion of the word line 802 and a portion of the corresponding pillar electrode 806 also surrounded by the word line 802 serve as electrodes of the memristor cell. The memristor layer 808 may be formed of a variety of materials. The memristor layer 808 may be oxide-based, meaning that at least a portion of the memristor is formed from an oxide-containing material. The memristor layer 808 may also be nitride-based, meaning that at least a portion of the memristor is formed from a nitride-containing composition. Furthermore, the memristor layer 808 may be oxy-nitride based, meaning that a portion of the memristor is formed from an oxide-containing material and that a portion of the memristor is formed from a nitride-containing material. In some examples, the memristor layer 808 may be formed based on tantalum oxide (TaOx) or hafnium oxide (HfOx) compositions. Other example materials of the memristor layer 808 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning materials may be employed in the practice of the teachings herein. For example, the memristor layer 808 may have multiple layers that include electrodes and dielectric materials.

In some other embodiments, the stacked layer structure of word lines separated by the insulation walls 804 is formed using a lithography technique. Thereafter, portions corresponding to the memristor layers 808 and the pillar electrodes 806 are formed by etching in the similar manner as the above manufacturing method. This manufacturing method requires only a few more masks to form patterning for the insulation walls 804, in comparison to structure without the insulation walls 804.

According to the SWL 3D vertical memristor array of some embodiments, a 3D memristor array including the SWL 3D vertical memristor array can be employed for a matrix-matrix multiplication, which enables a faster calculation for various purposes, including AI-based operations, such as image recognition, pattern matching, and solving of NP-hard problems. A matrix-matrix multiplication can be carried out according to a conversion scheme discussed in detail in a U.S. patent application Ser. No. 16/062,578, filed on Jun. 14, 2018, entitled "Improved Computational Accuracy in a Crossbar Array," the entire contents of which are incorporated herein by reference.

According to the SWL 3D vertical memristor array of some embodiments, a 3D memristor array including the SWL 3D vertical memristor array can be connected to sensor arrays, such as image sensors, transducer arrays, and so on, to process obtained sensor data signals, such as image data signals, to perform an image analysis or other computer-based image processing. Since the obtained sensor data signals can be directly introduced into the 3D memristor array for the processing, the processing can be carried out quickly without needing further calculation.

Further, according to the SWL 3D vertical memristor array of some embodiments, the 3D memristor array including the SWL 3D vertical memristor array can be configured in a compact size, because of its density of the memristor cells, as opposed to conventional 3D horizontal memristor array. For that reason, the 3D memristor array of some embodiments may be employed for various IoT devices including smartphones, smart watches, smart speakers, personal computers, tablets, and smart home appliances, and so on.

Figure 9:
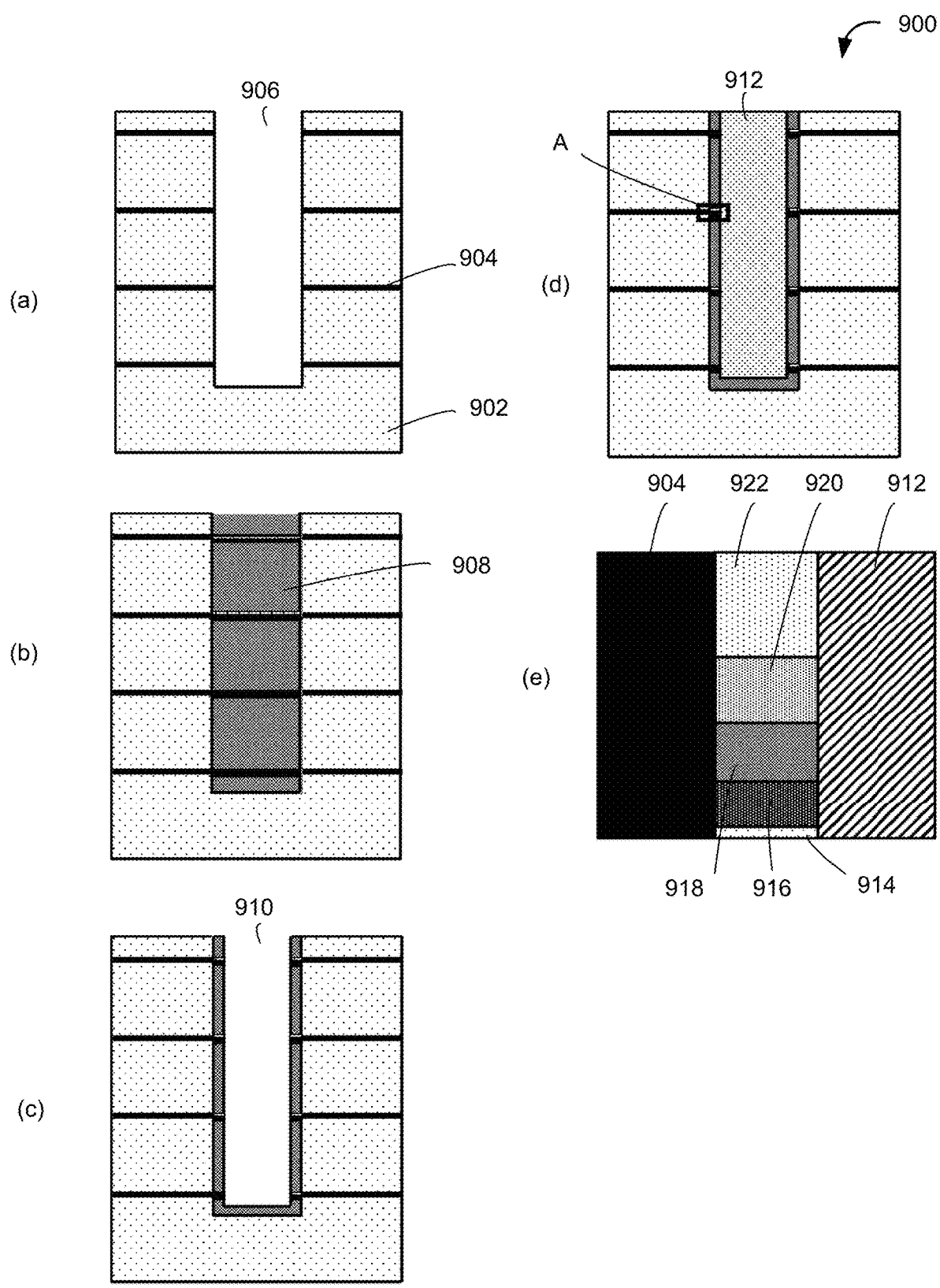
FIG. 9 is a schematic diagram illustrating an exemplary manufacturing method of a 3D memristor array according to some embodiments.

FIG. 9 is a schematic diagram 900 illustrating only one among a plurality of exemplary manufacturing methods of a 3D memristor array according to some embodiments. In FIG. 9, a portion of the 3D memristor array corresponding to one via hole is illustrated. Depending on a specific implementation, the same structure can be formed two-dimensionally, and a 3D memristor array including a plurality of memristor cells formed around each of a plurality of via holes may be formed. In the exemplary manufacturing method, first, an insulating layer 902 and a layer of word lines 904 are repetitively formed on a substrate, by employing any applicable lithography technique. As a result a structure including a plurality of word lines 904 at multiple levels in the stack of the insulating layers 902 is formed.

Thereafter, as shown in (a) of FIG. 9, a via hole 906 is formed in the structure, such that the via hole 906 pass through each of the plurality of word lines 904 at the multiple levels. The via hole 906 may be formed by employing any applicable lithography and etching technique.

Thereafter, as shown in (b) of FIG. 9, a set of memristor layers 908 is formed inside the via hole 906. The set of memristor layers 908 may be formed by repeatedly depositing one or more layers of a metal oxide having different concentrations of oxygen for a single memristor cell in the via hole 906. The specific structure of the memristor layer 908 is described below with reference to (e) of FIG. 9.

Thereafter, as shown in (c) of FIG. 9, a via hole 910 is formed in the deposited metal oxide layers by employing any applicable lithography and etching technique.

Thereafter, as shown in (d) of FIG. 9, a pillar electrode 912 is formed in the via hole 912 by employing any applicable deposition technique. As a result, a plurality of memristor cells at formed at cross points of the pillar electrodes and the word lines, around the pillar electrode. The region A is one of the plurality of memristor cells and an enlarged view of the region A is illustrated in (e) of FIG. 9.

As illustrated in (e) of FIG. 9, a memristor device is formed with a portion of the corresponding word line 904, a portion of the pillar electrode 912, and a portion of the memristor layer 908 including multiple metal oxide regions 914-922 having different concentrations of oxygen. In a specific implementation, the portion of the memristor layer 908 including multiple metal oxide regions 914-922 may correspond to the memristor layer 106 including the first, second, third, fourth, and fifth metal oxide regions 108-116 in FIG. 1. That is, the multiple metal oxide regions 914-922 may have different concentrations of oxygen, such that a voltage-conductance characteristic of each of the memristor cells during electrical operation is controlled based on the different concentrations of oxygen of the plurality of regions.

The exemplary manufacturing process described by FIG. 9 may also be carried out in a different order to enable ease of manufacturing. Such a process may also be carried out in different batches, such that each batch of manufacturing produces only a part of the final desired structure.

In some embodiments, the voltage-conductance characteristic of each of the memristor cells is a voltage-conductance relationship when a voltage applied to the memristor cell increases. In some embodiments, the voltage-conductance characteristic of each of the memristor cells is a voltage-conductance relationship when a voltage applied to the memristor cell decreases. In some embodiments of the operation of the memristor cell, electrical current could be used as an alternate to voltage. Similarly, either current or voltage could be applied as static signals (as direct current) or as dynamical signals (alternating current or pulse signals). Conductance may also be interchangeably used with resistance, conductivity or resistivity.

In some embodiments, when the memristor layer 908 is formed, a dopant may be introduced thereinto. Therefore, the multiple metal oxide regions 914-922 may have different concentrations of the dopant. The different concentrations of the dopant may be configured, such that a voltage-conductance characteristic of the memristor cells during electrical operation is controlled based on the different concentrations of the dopant of the plurality of regions.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, the use of particular terminology when describing certain features or aspects of the invention should not be taken to imply that the terminology is being redefined herein to be restricted to including any specific characteristics of the features or aspects of the invention with which that terminology is associated. The scope of the invention should therefore be construed in accordance with the appended claims and any equivalents thereof.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments. Alternatively, one or more embodiments necessarily include logic for deciding, with or without user input or prompting, whether these features, elements and/or steps are included or are to be performed in any particular embodiment.

The invention claimed is:

1. A memristor device comprising:
    a first electrode;
    a second electrode; and
    a memristor layer formed of a metal oxide and disposed between the first electrode and the second electrode,
        wherein the memristor layer includes a plurality of regions that extend between the first electrode and the second electrode,
        wherein the plurality of regions comprises a center region, a first surrounding region, and a second surrounding region,
        wherein a first oxygen concentration of the center region is lower than the first surrounding region, and a second oxygen concentration of the first surrounding region is lower than the second surrounding region before electrical operation,
        wherein, during electrical operation, a voltage-conductance characteristic of the memristor device is controlled based on the first oxygen concentration and the second oxygen concentration of the plurality of regions, and
        wherein the controlling of the voltage-conductance characteristic including increasing or decreasing the conductance of the memristor device toward a target conductance at a specific voltage.

2. The memristor device of claim 1, wherein the controlling of the voltage-conductance characteristic includes increasing or decreasing the conductance of the memristor device toward a plurality of target conductances in a voltage range.

3. The memristor device of claim 2,
    wherein the voltage-conductance characteristic indicates a voltage-conductance relationship between the voltage and the conductance of the memristor device, and wherein the controlling of the voltage-conductance characteristic causes the voltage-conductance relationship to become linear or more linear in the voltage range.

4. The memristor device of claim 3, wherein the voltage-conductance relationship becomes more linear as compared with (i) the voltage-conductance relationship of the memristor device prior to the controlling of the voltage-conductance characteristic, or (ii) a voltage-conductance relationship of an otherwise comparable memristor device having a metal-oxide memristor layer with a uniform concentration of oxygen or a more uniform concentration of oxygen.

5. The memristor device of claim 1, wherein the plurality of regions of the memristor layer are created with different concentrations of a dopant before electrical operation, and, during electrical operation, a voltage-conductance characteristic of the memristor device is controlled based on the different concentrations of the dopant of the plurality of regions.

6. The memristor device of claim 1, wherein the plurality of regions of the memristor layer are concentric regions.

7. The method of claim 1, wherein the first surrounding region and the second surrounding region comprise the metal oxide at different concentrations of one or more ingredients.

8. The method of claim 1, wherein the plurality of regions is fewer than five.

9. A memristor-based computing apparatus comprising:
an array of pillar electrodes arranged in a first direction and a second direction, each of the pillar electrodes extending in a third direction;
an array of word lines arranged in the first direction and the third direction, each of the word lines extending in the second direction; and
a plurality of memristor cells formed at cross points of the pillar electrodes and the word lines around the pillar electrode,
wherein each of the memristor cells includes a plurality of regions formed between one of the pillar electrodes and one of the word lines,
wherein the plurality of regions comprises a center region, a first surrounding region, and a second surrounding region,
wherein a first oxygen concentration of the center region is lower than the first surrounding region, and a second oxygen concentration of the first surrounding region is lower than the second surrounding region before electrical operation, and
wherein, during electrical operation, a voltage-conductance characteristic of each of the memristor cells is controlled based on the first oxygen concentration and the second oxygen concentration of the plurality of regions, and
the controlling of the voltage-conductance characteristic including increasing or decreasing the conductances of the memristor cells toward a target conductance at a specific voltage.

10. The memristor-based computing apparatus of claim 9, wherein the controlling of the voltage-conductance characteristic includes increasing or decreasing the conductances of the memristor cells toward a plurality of target conductances in a voltage range.

11. The memristor-based computing apparatus of claim 10, wherein
wherein the voltage-conductance characteristic indicates a voltage-conductance relationship between the voltage and the conductance of the memristor cells, and
wherein the controlling of the voltage-conductance characteristic causes the voltage-conductance relationship to become linear or more linear in the voltage range.

12. The memristor-based computing apparatus of claim 11, wherein the voltage-conductance relationship becomes more linear as compared with (i) the voltage-conductance relationship of the memristor cells prior to the controlling of the voltage-conductance characteristic, or (ii) a voltage-conductance relationship of an otherwise comparable memristor cell having a metal-oxide memristor layer with a uniform concentration of oxygen or a more uniform concentration of oxygen.

13. The memristor-based computing apparatus of claim 9, wherein the plurality of regions of each of the memristor cells are created with different concentrations of a dopant before electrical operation, and, during electrical operation, a voltage-conductance characteristic of the memristor cell is controlled based on the different concentrations of the dopant of the plurality of regions.

14. The memristor-based computing apparatus of claim 9, further comprising:
a control circuit configured to perform a matrix-matrix or vector-matrix multiplication by programming data in at least a part of the memristor cells.

15. A method for manufacturing a memristor device comprising:
forming a first electrode;
forming a metal oxide layer on the first electrode;
forming a first mask on a first region of the metal oxide layer to be formed as a memristor layer, and introducing oxygen to a second region of the metal oxide layer not covered by the first mask;
forming a second mask on the second region and a third region within the first region, and introducing oxygen to a fourth region of the metal oxide layer not covered by the second mask, such that a voltage-conductance characteristic of the memristor device during electrical operation is controlled based on different concentrations of oxygen of the third and fourth regions, the controlling of the voltage-conductance characteristic including increasing or decreasing the conductance of the memristor device toward a target conductance at a specific voltage; and
forming a second electrode on the metal oxide layer.

16. The method of claim 15, wherein the controlling of the voltage-conductance characteristic includes increasing or decreasing the conductance of the memristor device toward a plurality of target conductances in a voltage range.

17. The method of claim 16,
wherein the voltage-conductance characteristic indicates a voltage-conductance relationship between the voltage and the conductance of the memristor device, and
wherein the controlling of the voltage-conductance characteristic causes the voltage-conductance relationship to become linear or more linear in the voltage range.

18. The method of claim 17, wherein the voltage-conductance relationship becomes more linear as compared with (i) the voltage-conductance relationship of the memristor device prior to the controlling of the voltage-conductance characteristic, or (ii) a voltage-conductance relationship of an otherwise comparable memristor device having a metal-oxide memristor layer with a uniform concentration of oxygen or a more uniform concentration of oxygen.

19. The method of claim 15, further comprising introducing a dopant to the fourth region of the metal oxide layer not covered by the second mask, such that a voltage-conductance characteristic of the memristor device during electrical operation is controlled based on the different concentrations of the dopant of the plurality of regions.

20. The method of claim 15, wherein the first region and the third regions are concentric regions.

21. A method for manufacturing a memristor device comprising:
    forming a first electrode;
    forming a metal oxide layer on the first electrode;
    forming a mask on a first region of the metal oxide layer to be formed as a memristor layer, and patterning the metal oxide layer using the mask;
    introducing oxygen to a side surface of the patterned metal oxide layer, such that a voltage-conductance characteristic of the memristor device during electrical operation is controlled based on different concentrations of oxygen of the third and fourth regions, the controlling of the voltage-conductance characteristic including increasing or decreasing the conductance of the memristor device toward a target conductance at a specific voltage;
    after the introducing oxygen, forming a cover layer on an exposed surface of the first electrode to cover the side surface of the patterned metal oxide layer;
    performing planarization on the cover layer and the mask to expose an upper surface of patterned metal oxide layer; and
    forming a second electrode on the upper surface of the metal oxide layer.

22. The method of claim 21, further comprising annealing the patterned metal oxide layer, such that gradient of the concentrations of oxygen of the third and fourth regions becomes smoother.

23. The method of claim 21, wherein the controlling of the voltage-conductance characteristic includes increasing or decreasing the conductance of the memristor device toward a plurality of target conductances in a voltage range.

24. The method of claim 23,
    wherein the voltage-conductance characteristic indicates a voltage-conductance relationship between the voltage and the conductance of the memristor device, and
    wherein the controlling of the voltage-conductance characteristic causes the voltage-conductance relationship to become linear or more linear in the voltage range.

25. The method of claim 24, wherein the voltage-conductance relationship becomes more linear as compared with (i) the voltage-conductance relationship of the memristor device prior to the controlling of the voltage-conductance characteristic, or (ii) a voltage-conductance relationship of an otherwise comparable memristor device having a metal-oxide memristor layer with a uniform concentration of oxygen or a more uniform concentration of oxygen.

26. The method of claim 21, further comprising introducing a dopant to the side surface of the patterned metal oxide layer, such that a voltage-conductance characteristic of the memristor device during electrical operation is controlled based on the different concentrations of the dopant of the plurality of regions.

* * * * *